United States Patent [19]

Ichikawa et al.

[11] Patent Number: 6,150,715
[45] Date of Patent: Nov. 21, 2000

[54] SEMICONDUCTOR DEVICE WITH RADIATION PLATE FOR HIGH RADIATION CHARACTER AND METHOD OF MANUFACTURING THE SAME

[75] Inventors: Seiji Ichikawa; Takeshi Umemoto; Kazunari Sato; Kunihiko Tsubota; Yoshikazu Nishimura; Toshiaki Nishibe; Kazuhiro Tahara; Masato Suga; Toru Kitakoga; Tatsuya Miya; Keita Okahira, all of Tokyo, Japan

[73] Assignee: NEC Corporation, Tokyo, Japan

[21] Appl. No.: 09/123,448

[22] Filed: Jul. 28, 1998

[30] Foreign Application Priority Data

Aug. 5, 1997 [JP] Japan .................................. 9-210849

[51] Int. Cl.⁷ .................... H01L 23/50; H01L 23/495; H01L 23/48; H01L 23/28
[52] U.S. Cl. ..................... 257/706; 257/675; 257/692; 257/693; 257/684; 257/699; 257/666; 257/797; 257/796; 257/712; 257/676; 174/52.2; 361/820; 361/723
[58] Field of Search ..................... 257/797, 712, 257/713, 666, 676, 675, 720, 704, 730–733, 649, 684, 693, 692; 174/52.2; 361/723, 820

[56] References Cited

U.S. PATENT DOCUMENTS

| | | |
|---|---|---|
| 3,820,153 | 6/1974 | Quinn ..................................... 257/712 |
| 3,825,803 | 7/1974 | Budde .................................... 257/712 |
| 4,392,151 | 7/1983 | Iwatani ................................... 257/712 |
| 4,465,130 | 8/1984 | Romania et al. ....................... 361/389 |
| 5,365,106 | 11/1994 | Watanabe .............................. 257/676 |
| 5,434,407 | 7/1995 | Fehr et al. .............................. 257/699 |
| 5,479,050 | 12/1995 | Pritchard et al. ...................... 257/676 |
| 5,583,371 | 12/1996 | Hori ....................................... 257/675 |
| 5,629,561 | 5/1997 | Shin et al. .............................. 257/712 |
| 5,637,923 | 6/1997 | Kasai et al. ............................ 257/738 |
| 5,703,398 | 12/1997 | Sono et al. ............................. 257/706 |
| 5,789,812 | 8/1998 | Takahashi .............................. 257/738 |
| 5,859,387 | 1/1999 | Gagnon ................................. 257/676 |
| 5,869,889 | 2/1999 | Chia et al. ............................. 257/712 |

FOREIGN PATENT DOCUMENTS

| | | |
|---|---|---|
| 6-252318 | 9/1994 | Japan . |
| 8-111491 | 4/1996 | Japan . |
| 2907186 | 4/1999 | Japan . |

*Primary Examiner*—Alexander O. Williams
*Attorney, Agent, or Firm*—Sughrue, Mion, Zinn Macpeak & Seas, PLLC

[57] ABSTRACT

A semiconductor device of the present invention comprises a semiconductor pellet, a radiation plate mounted with the semiconductor pellet, a plurality of lead terminals electrically connected with the semiconductor pellet, and a resin member for encapsulating the above items. The resin member has a first surface and a second surface, and the radiation plate has a first portion exposed to the outside from the first surface of the resin member and a second portion exposed to the outside from the second surface of the resin member.

6 Claims, 6 Drawing Sheets

SEMICONDUCTOR DEVICE WITH RADIATION PLATE FOR HIGH RADIATION CHARACTER AND METHOD OF MANUFACTURING THE SAME

BACKGROUND OF THE INVENTION

1. Field of the Invention

The present invention relates to a semiconductor device comprising a pellet mounted on a radiation plate, the pellet and the radiation plate being resin-sealed together and a method of manufacturing the same.

2. Description of the Related Art

Semiconductor devices such as LSI (Large Scale Integrated Circuit) or MMI (Micro Monolithic Integrated Circuit) have heretofore been used in various kinds of electronic apparatus. For example, in a portable telephone, a semiconductor device which consumes a large quantity of electric power, such as an amplifier for the transmission/reception signal, is mounted in a micro cell.

Generally, the larger the power consumption of a semiconductor device is, the higher the temperature when the device is heated. Since the device life becomes short when the temperature in use is high, a semiconductor device which generates a remarkable amount of heat is equipped with a radiation plate. The radiation plate becomes more effective with a larger surface area, but in small devices such as a portable telephone, it is difficult to provide a large radiation plate in the semiconductor device.

Accordingly, in a general semiconductor device, for the purpose of preventing an excessive temperature rise of the device, how to effectively radiate the heat for maintaining the temperature in use at a low level becomes an important problem. In a semiconductor device like this, a pellet of a semiconductor device is mounted on the radiation plate. Electrode pads of the pellet are connected to lead terminals arrayed on its circumference by means of bonding wires, and the bonding wires, the inner part of the lead terminals and the pellet are sealed with a resin member.

Since the outer part of the lead terminal is projected outside from the resin member, when the semiconductor device is mounted on a circuit substrate and the lead terminals are connected to signal lines of the circuit substrate, it becomes possible to input various signals into the pellet or output from the pellet. Further, since the lower surface and the end portion of the radiation plate are exposed outside of the resin member, by connecting these portions to a conductor pattern of the circuit substrate, the generated heat in the pellet can be radiated to the conductor pattern of the circuit substrate through the radiation plate.

However, there is a possibility that the conductor pattern of the circuit substrate may become hot according to circumstances, and under these circumstances, it is difficult to radiate the generated heat in the pellet satisfactorily to the conductor pattern.

On the other hand, there is a semiconductor device in which a portion of the radiation plate is exposed to the upper surface of the resin member to radiate the generated heat in the pellet to the open air by means of the radiation plate. However, the method of radiating the heat to the open air is less effective compared with the method in which the heat is radiated to the conductor pattern as above described, and a good radiative property can not be expected if the temperature of the open air surrounding the semiconductor device is high.

Further, with the structure in which a flat radiation plate having the pellet mounted on its upper surface is exposed to the lower surface of the resin member, there is a fear that the radiation plate may fall off the resin member if no protective means is added. Therefore, in the prior method, the side of the radiation plate is bent into a form of a crank and set inside the resin member to prevent the falling of the plate. However, the provision of a part for the exclusive use of fixing the radiation plate to the resin member is unpreferable because it will decrease the productivity of the semiconductor device.

SUMMARY OF THE INVENTION

It is an object of the present invention to provide a semiconductor device which is capable of radiating well the heat in generated of a pellet and a method of manufacturing the same.

The semiconductor device according to the present invention comprises a semiconductor pellet, a portion of a radiation plate on which the semiconductor pellet is mounted, the inside portion of a plurality of lead terminals, and bonding wires connecting the semiconductor pellet and lead terminals respectively, which are all encapsulated with a resin member which has a first surface and a second surface. Particularly, the radiation plate has a first portion which is exposed to the outside from the first surface of the resin member and a second portion which is exposed to the outside from the second surface of the resin member.

Since the first portion of the radiation plate on which the semiconductor pellet is mounted is exposed to the first surface of the resin member, for example, if the first surface of the resin member is mounted on a circuit substrate, by connecting the first portion of the radiation plate to a conductor pattern of the circuit substrate, the heat generated in the semiconductor pellet is radiated to the conductor pattern of the circuit substrate through the first portion of the radiation plate. On the other hand, since the second portion of the radiation plate is exposed to the second surface of the resin member, the heat generated in the semiconductor pellet is radiated from the second portion to the ambient open air. Therefore, even if the temperature of one of the circuit substrate or the open air is high, when the temperature of the other one is low, the generated heat of the semiconductor pellet can be radiated well from the radiation plate.

Further, when the first surface of the resin member is mounted on the circuit substrate, by making the second surface the opposite surface of the first surface, the heat can be radiated well to the open air through the second portion of the radiation plate. In this case, the radiation plate may be made of a sheet of metal plate in which the central portion is bent toward the first surface of the resin member and both end portions at opposite ends of the central portion are bent toward the second surface of the resin member. Alternatively, the radiation plate may be made of a sheet of metal plate of which the central portion is bent toward the second surface of the resin member and both end portions at opposite ends of the central portion are bent toward the first surface of the resin member. With the above structure, since the central portion and both end portions of the radiation plate are situated on the upper surface and the lower surface of the resin member, respectively, the radiation plate can be prevented from falling off the resin member without requiring a holder for the exclusive use of the radiation plate. In this case, the semiconductor pellet may preferably be mounted on the central portion of the radiation plate. In addition, arraying the lead terminals on the outside of both the side portions of the radiation plate will facilitate the connection of electrode pads of the semiconductor pellet and the lead terminals by means of the bonding wires.

A manufacturing method of the semiconductor device according to present invention comprises the steps of: connection a plurality of lead terminals and a sheet of the radiation plate in one unit with a tiebar to form a lead frame; bending this lead frame into a predetermined form; placing the semiconductor pellet on the central portion of the lead frame; electrically connecting the semiconductor pellet and the lead terminals; and encapsulating a part of the lead frame, the semiconductor pellet and bonding wires with the resin member. In the bending step of the lead frame, the central portion of the radiation plate is bent in the direction of thickness of the lead frame, and both the end portions at the opposite ends of the central portion are bent in the direction opposite to the direction of bending of the central portion to form a predetermined shape. In the encapsulating step, encapsulating operation is carried out so that the outside portion of the lead frame, one surface of the central portion of the radiation plate and one surface of each of both the end portions of the radiation plate are exposed.

Since the central portion and both the end portions of the radiation plate of the lead frame are bent to opposite sides from each other, as described above, one surface of the central portion and one surface of each of the two end portions are exposed to a different location on the resin member. Consequently, the semiconductor device according to the present invention can be manufactured with ease.

In the manufacturing method according to the present invention, for performing the encapsulating operation with the resin member, the lead frame provided with the united semiconductor pellet and bonding wires is held at the outer portion of the lead terminal and disposed inside a cavity of a mold so that one surface of the central portion and one surface of each of both the end portions of the radiation plate contact the inside of the cavity of the mold. Then, melted resin is filled and solidified in the cavity. Through the above steps, the encapsulating process using the resin member in which a portion of the radiation plate is exposed outside can be performed with ease.

It should be noted that, in the present specification, although the direction in which the semiconductor device is mounted on the circuit substrate is called an upper part and the direction perpendicular to that is called a side part, this is for convenience sake to make explanation simpler and does not limit the direction in the manufacture or use of the real apparatus.

Further, the radiation plate in the present invention means the member on which the pellet is mounted and it contributes to achieve heat radiation, for example, the member includes such as a metal die pad.

The above other objects, features and advantages of the present invention will become apparent from the following description with reference to the accompanying drawings which illustrate examples of the present invention.

Figure 1A:
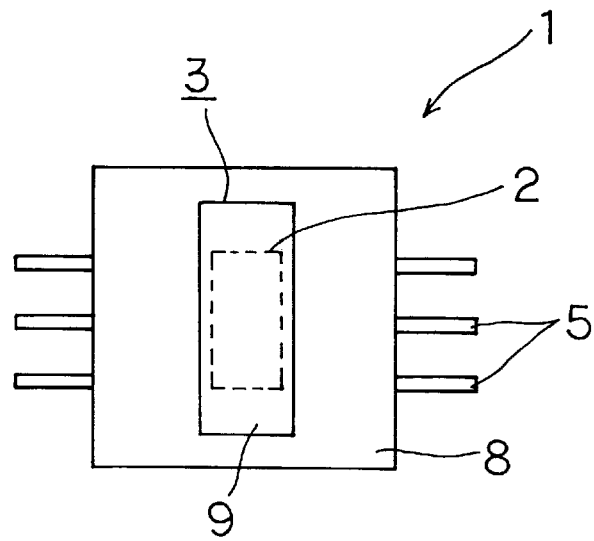
FIGS. 1a to 1d are a bottom view, a plan, a front view and a side elevation, respectively, of a semiconductor device of a first embodiment according to the present invention.
Figure 1E:
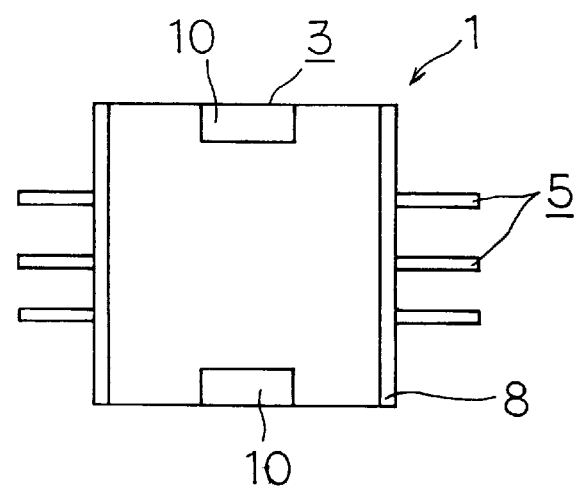
Figure 1D:
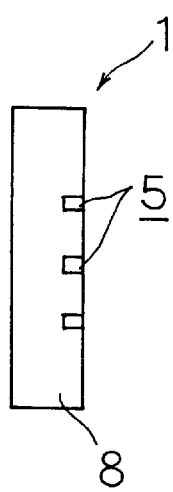
Figure 1C:
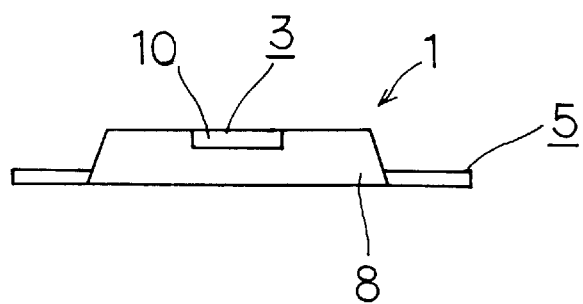

DESCRIPTION OF THE PREFERRED EMBODIMENTS (First Embodiment)

As shown in FIGS. 1a to 1d, FIG. 2 and FIG. 3, a semiconductor device 1 according to the present embodiment has a semiconductor pellet 2 on which an integrated circuit is formed. The pellet 2 is placed on a radiation plate 3 which serves as a metal die pad. A plurality of electrode pads 4 are provided on the surface of the pellet 2, and a plurality of lead terminals 5 are arrayed on both sides of the radiation plate 3.

Figure 3:
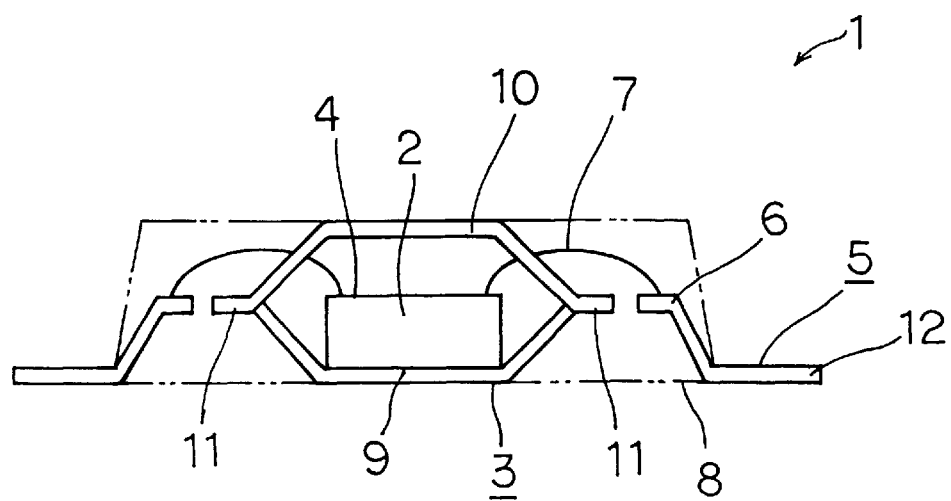
FIG. 3 is a front view showing an internal structure of the semiconductor device shown in FIGS. 1a to 1d.

As shown in FIG. 3, the electrode pads 4 and the inner portions 6 of the lead terminals 5 are connected by bonding wires 7 respectively, and the pellet 2, a part of the radiation plate 3, the bonding wires 7, the inner portions 6 of the lead terminals 5 are encapsulated in the resin member 8 of a flat rectangular parallelepiped shape.

The radiation plate 3 is formed in a shape in which both end portions 10 at the opposite ends of the central portion 9 are positioned higher than the central portion 9. The pellet 2 is placed on the upper surface of the central portion 9. The upper surface of both the end portions 10 of the radiation plate 3 are exposed to the outside from the upper surface of the resin member 8 and the under surface of the central portion 9 of the radiation plate 3 is exposed to the outside from lower surface of the resin member 8.

Figure 2:
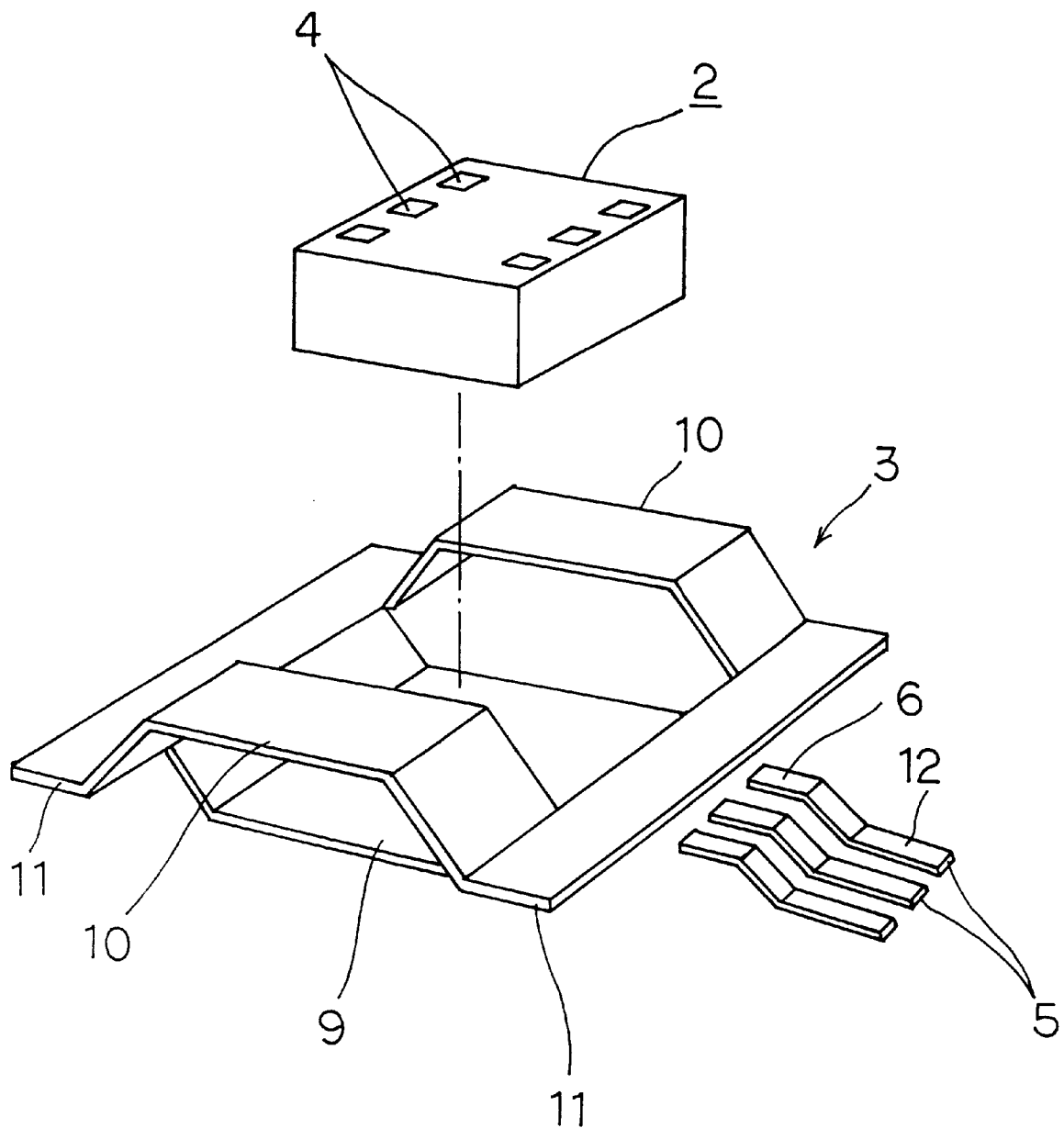
FIG. 2 is an exploded perspective view showing a form and the positional relationship of a radiation plate, a lead terminal and a pellet of the semiconductor device shown in FIGS. 1a to 1d.

Specifically, as shown in FIG. 2, the central portion 9 of the radiation plate 3 is formed on the whole in a downwardly projected concave shape with both right and left sides bent upwards, and both the end portions 10 are each formed on the whole in an upwardly projected convex shape with both right and left sides bent downwards. Both side portions 11 of the radiation plate 3 are formed in a longitudinally slender rectangular shape. The side portions 11 are connected with the central portion 9 and the end portions 10.

The lead terminals 5 are formed in a crank shape and outer portions 12 projected from the resin member 8 are situated on a surface of the same level with the lower surface of the resin member 8. Inner portions 6 of the lead terminals 5 are positioned higher than the outer portions 12, for example, positioned on a surface of the same level with the upper surface of the pellet 2 and the upper surface of both the side portions 11 of the radiation plate 3.

In the structure as described above, the semiconductor device 1 is mounted on a upper surface of a circuit substrate (not shown). In this case, the outer portions 12 of a plurality of lead terminals 5 projected from the side of the resin member 8 are connected with a plurality of signal lines of the circuit substrate respectively by means of solder, and the under surface of the central portion 9 of the radiation plate 3 exposed to the outside from the under surface of the resin member 8 is connected with a conductor pattern such as ground wiring of the circuit substrate by means of solder.

In the conditions as described above, since the pellet 2 can input/output various signals to and from the signal lines of the circuit substrate through the lead terminals 5, the semiconductor device 1 can execute processing of various signals. The pellet 2 which functions in this way generates heat inevitably, but the generated heat is well radiated through the radiation plate 3.

In other words, the central portion 9 of the radiation plate 3 on which the pellet 2 is mounted is exposed to the outside from the lower surface of the resin member 8, the central portion 9 being directly connected with the conductor pattern of the circuit substrate, and hence the heat generated in the pellet 2 can suitably be radiated to the circuit substrate through the central portion 9. Further, since both the end portions 10 of the radiation plate 3 are exposed to the outside from the upper surface of the resin member 8, the heat generated in the pellet 2 can preferably be radiated to the ambient open air by the radiation plate 3 through both the end portions 10 thereof.

As described above, the semiconductor device 1 of the present embodiment can radiate the heat generated in the pellet 2 to both the conductor pattern of the circuit substrate and the ambient open air through the radiation plate 3. Therefore, for example, even if the temperature of either one of the circuit substrate or the open air is high, when the temperature of the other one is low, it is possible to satisfactorily radiate the heat generated in the pellet 2.

Further, in the semiconductor device 1 of the present embodiment, since the central portion 9 and both the end portions 10 of a piece of radiation plate 3 are positioned on the lower and upper surfaces of the resin member 8, respectively, it is unnecessary to provide the radiation plate 3 with an exclusive use holder to be positioned inside the resin member 8, because the radiation plate 3 being prevented from falling off the resin member 8.

Furthermore, it is noted that when the central portion 9 of the radiation plate 3 exposed to the outside from the lower surface of the resin member 8 is connected, as described above, with the conductor pattern of the circuit substrate by means of solder, it will be suitable, for example, to apply cream solder on at least one of the lower surface of the central portion 9 of the radiation plate 3 or the upper surface of the conductor pattern of the circuit substrate, next mount the semiconductor device 1 on the circuit substrate and then heat the whole to melt and finally solidify the cream solder.

Figure 4:
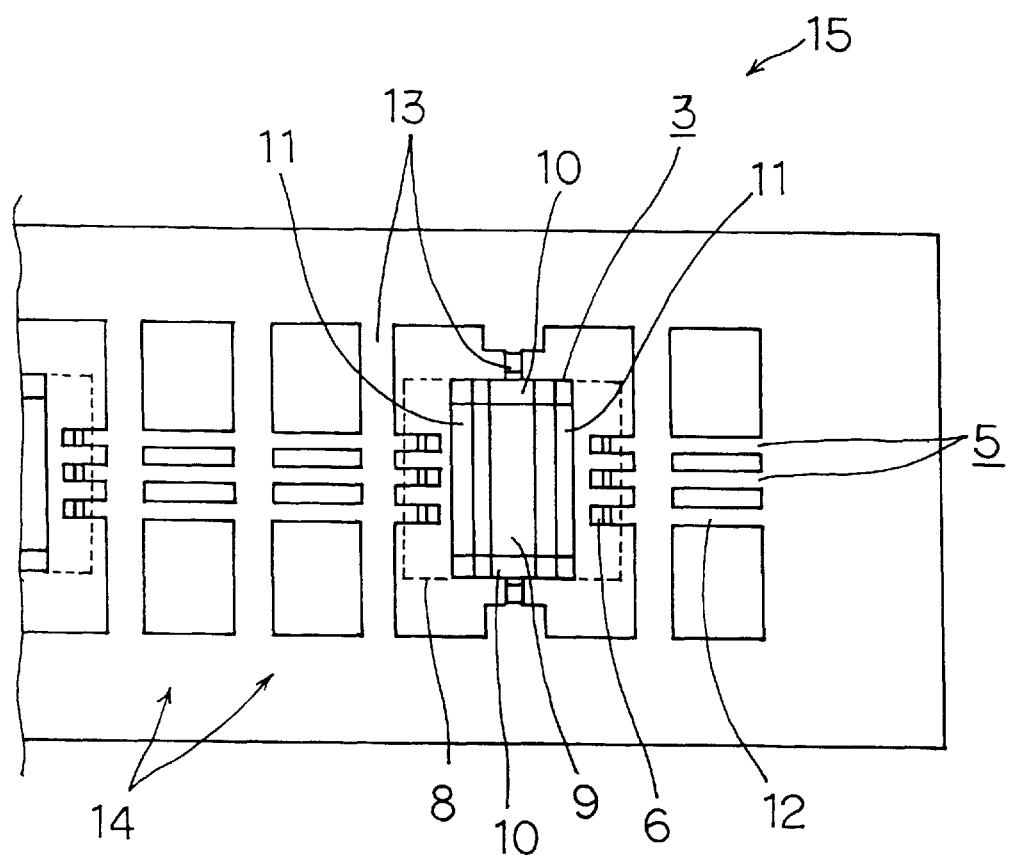
FIG. 4 is a plan showing a lead frame in one process of a manufacturing method according to the semiconductor device shown in FIGS. 1a to 1d.
Figure 5A:
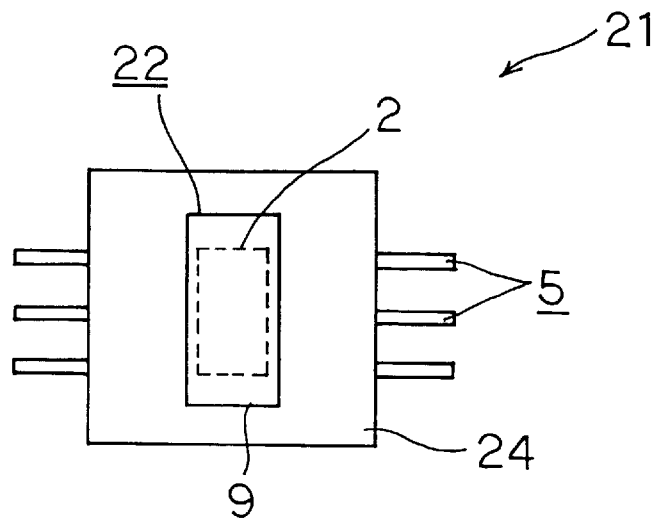
FIGS. 5a to 5d are a bottom view, a plan, a front view and a side elevation, respectively, of a modified example of the semiconductor device of the first embodiment according to the present invention.
Figure 5E:
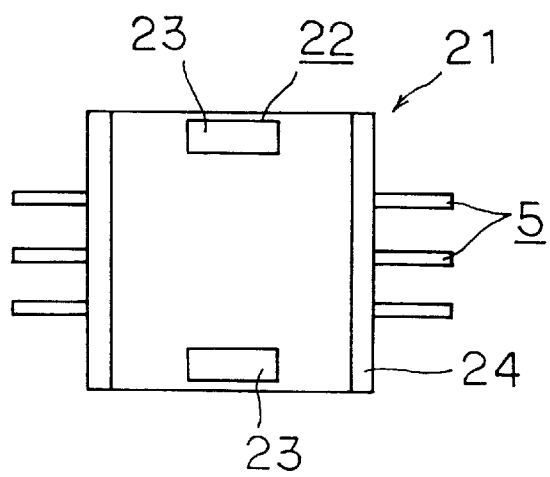
Figure 5D:
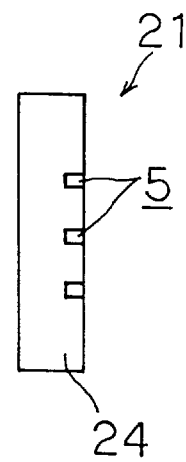
Figure 5C:
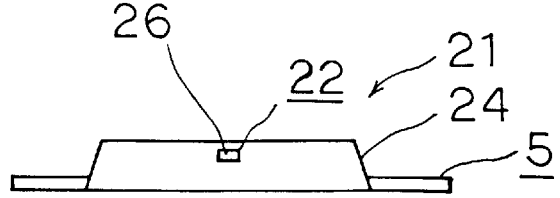

A manufacturing method of the semiconductor device 1 of the present embodiment will be described below with brief with reference to FIG. 4 and the like. First, as shown in FIG. 4, by etching an infinitesimally thin metal plate, unit pattern 14, in which a plurality of lead terminals 5 and a piece of radiation plate 3 are unitedly coupled by tiebars 13, is formed in a lead frame 15. It is noted that, in FIG. 4, only two pieces of unit patterns 14 of the semiconductor device 1 are formed in the lead frame 15 for simplifying the description, but in the real manufacture a number of unit patterns 14 are successively formed in a piece of lead frame 15.

According to the above etching process, since the central portion 9 and both the end portions 10 of the radiation plate 3 are separated by a pair of laterally slender slit-shaped penetration holes, by deforming the lead frame 15 by means of a lead forming die, the central portion 9 of the radiation plate 3 is bent into a downwardly projected concave form and both the end portions 10 are each bent into an upwardly projected convex form and concurrently the lead terminals 5 are bent into a crank form making the inner portions 6 position higher than the outer portions 12.

Next, as shown in FIG. 2 and FIG. 3, the pellet 2 is placed on the upper surface of the central portion 9 of the radiation plate 3, then the electrode pads 4 on the upper surface of the pellet 2 and the inner portions 6 of the lead terminals 5 are connected with the bonding wires 7 respectively. At this time, both the end portions 10 of the radiation plate 3 are positioned higher than the upper surface of the pellet 2 but are not positioned over the pellet 2, and hence the connection with the bonding wires 7 is easily executed.

The lead frame 15 in which the pellet 2 and the bonding wires 7 are mounted in a unit in this way is disposed inside a cavity of a pair of detachable molds. At this time, by holding the outer portions 12 of the lead terminals 5 with a pair of molds and at the same time making the lower surface of the central portion 9 and the upper surface of both the end portions 10 of the radiation plate 3 contact the inner surface of the mold, these portions are arranged exposed to the outside from the resin member 8.

By filling melted resin in the cavity of the mold and making it solidify in the above described state, the resin member 8 is formed including the pellet 2, a part of the radiation plate 3, the bonding wires 7 and the inner portions 6 of the lead terminals 5, all encapsulated in the resin member 8. Subsequently, by taking out this resin member 8 from the mold, removing such as flashes of resin and cutting off the tiebars 13 of the lead frame 15, the semiconductor device 1 is completed as shown in FIG. 1.

By manufacturing the semiconductor device 1 according to the method as described above, the structure of the semiconductor device 1, in which the lower surface of the central portion 9 of the radiation plate 3 is exposed to the outside from the lower surface of the resin member 8 and the upper surface of both the end portions 10 of the radiation plate 3 are exposed to the outside from both ends of the upper surface of the resin member 8, can be realized simply. Further, since the radiation plate 3 and the lead terminals 5 are concurrently formed from one piece of the lead frame 15, the productivity is better when compared to the case in which the radiation plate 3 and the lead terminals 5 are formed separately.

It is noted that the present invention is not limited to the above structure, but various modifications can be made within the scope of not deviating from the gist of the present invention. For example, in the above structure of the present invention, there is shown an example in which both the end portions 10 of the radiation plate 3 exposed to the outside from both ends of the upper surface of the resin member 8 radiate heat by directly contacting the open air, however, for example, it is possible to increase the heat radiation effect by mounting a heat sink (not shown) on each of both the end portions 10 of the radiation plate 3. Further, it is possible to adhere the upper surface of both the end portions 10 of the radiation plate 3 to the lower surface of a large-sized radiation plate (not shown) larger than the resin member 8 and fix both end portions of this large radiation plate to the circuit substrate with screws.

Further, although it is illustrated in the above structure that both the end portions 10 of the radiation plate 3 are designed so that they do not protrude outside from the end surface of the resin member 8 to form the whole body in a reduced size, it is possible to protrude both the end portions 10 of the radiation plate 3 from the end surface of the resin member 8 to increase the heat radiation effect.

Figure 6:
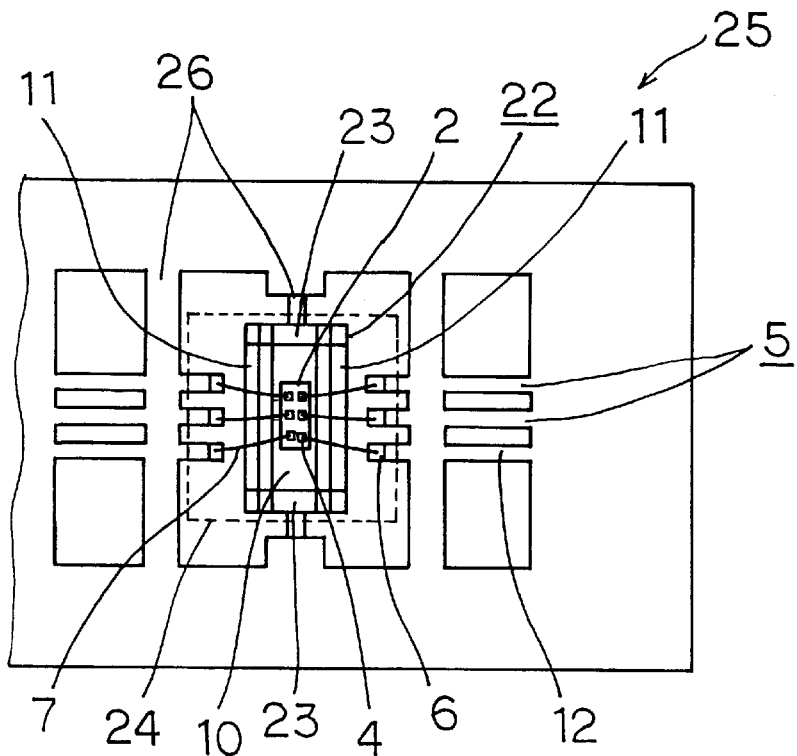
FIG. 6 is a plan illustrating a lead frame in one process of a manufacturing method of the semiconductor device shown in FIGS. 5a to 5d.

Still further, in the above structure, there is illustrated that both the end portions 10 of the radiation plate 3 are exposed to the outside from the front and rear surfaces on both ends of the upper surface of the resin member 8, however, as shown in FIGS. 5a to 5d, it is possible to provide a semiconductor device 21 which both end portions 23 of a radiation plate 22 are positioned on both ends of the upper surface of a resin member 24 slightly inside from the front and the rear edges, respectively. In this case, as shown in FIG. 6, it is appropriate to encapsulate tiebars 26 which support the radiation plate 22 of the lead frame 25 with the resin member 24 and cut off the tiebars 26 projected from the resin member 24.

(Second Embodiment)

Figure 7:
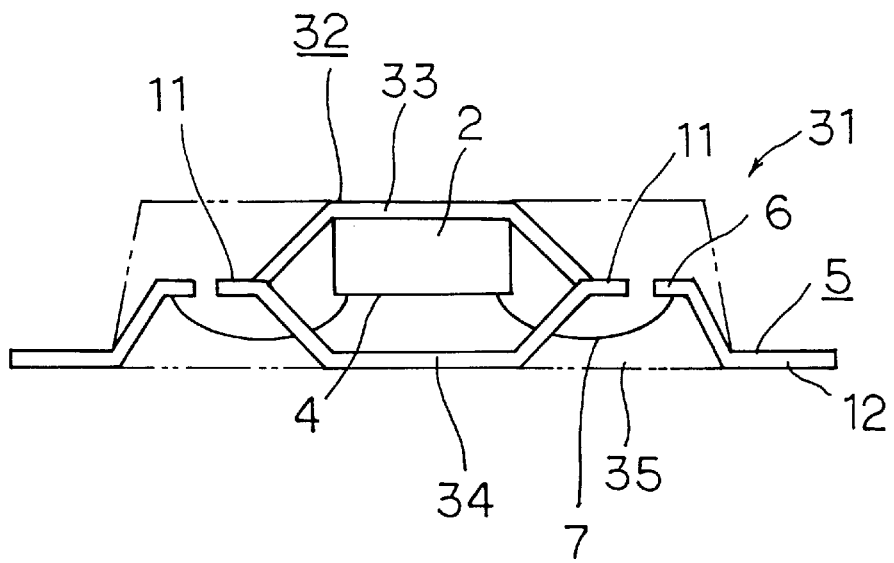
FIG. 7 is a front view showing an internal structure of a semiconductor device of a second embodiment according to the present invention.
Figure 8:
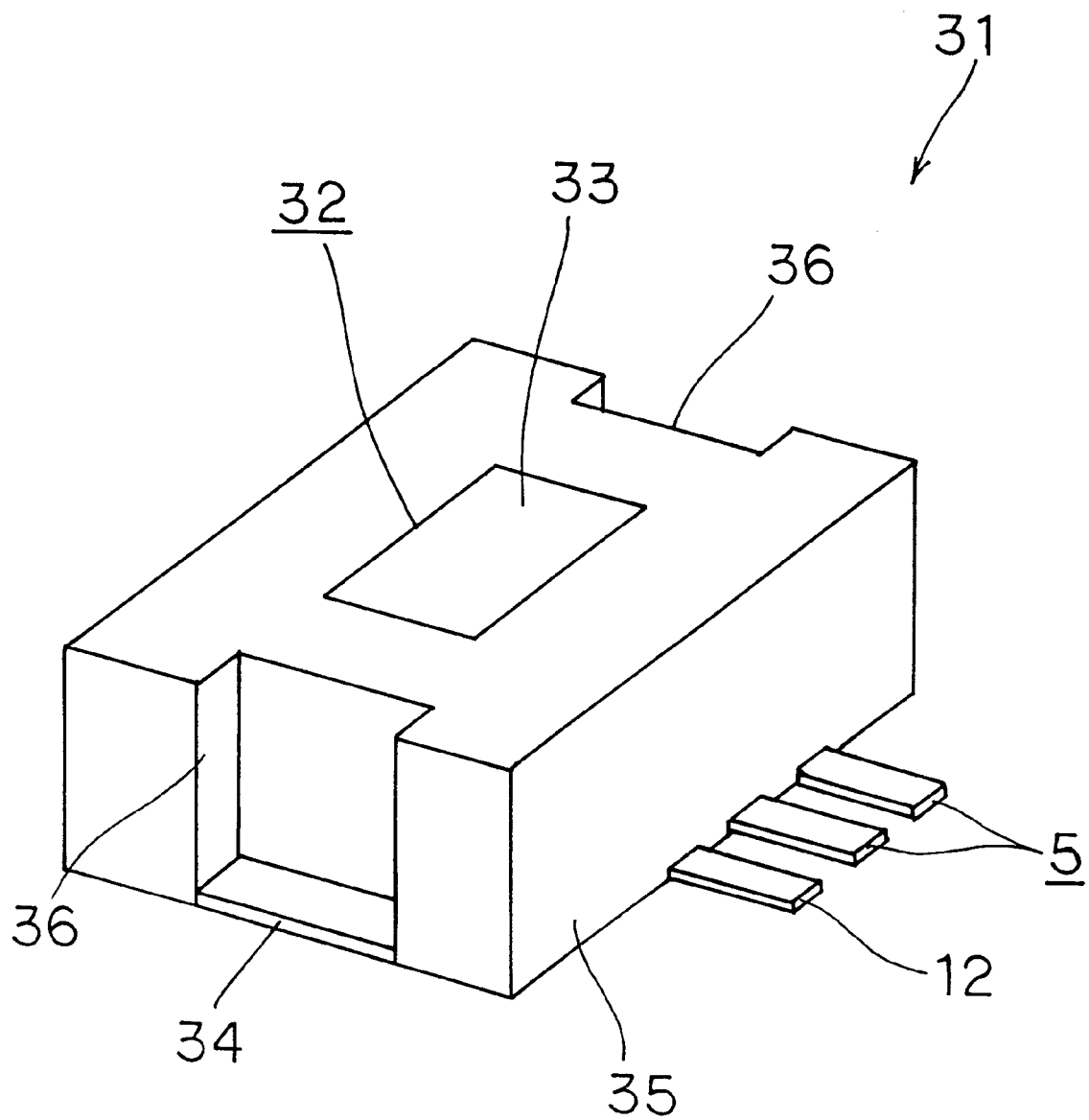
FIG. 8 is a perspective view showing an external appearance of the semiconductor device shown in FIG. 7.

A second embodiment of the present invention will be described below with reference to FIG. 7 and FIG. 8. With reference to the part of the second embodiment which is the same as that of the above first embodiment, the same symbol as that of the first embodiment will be used while omitting the detailed description thereof.

In a semiconductor device 31 according to the present embodiment, a semiconductor pellet 2 on which an integrated circuit is formed is mounted on a radiation plate 32 which serves as a metal die pad, a plurality of electrode pads 4 of the pellet 2 are connected with a plurality of lead terminals 5 arrayed on both sides of the radiation plate 32 by means of bonding wires 7, respectively.

However, the radiation plate 32 is formed in a shape in which a central portion 33 is positioned higher than both end portions 34, the pellet 2 being placed on the lower surface of the central portion 33. The upper surface of the central portion 33 of the radiation plate 32 is exposed to the outside from the upper surface of the resin member 35, and the under surfaces of both the end portions 34 of the radiation plate 32 are exposed to the outside from both ends of the lower surface of the resin member 35.

In other words, the radiation plate 32 of the semiconductor device 31 of the present embodiment is formed in a shape obtained by disposing the radiation plate 3 of the foregoing semiconductor device 1 upside down. It is noted that concave portions 36 are provided in the front and rear ends of the resin member 35 running from the upper surface to the lower surface thereof, respectively, both the end portions 34 of the radiation plate 32 being disposed in bottoms of these concave portions 36.

In the structure as described above, the semiconductor device 31 of the present embodiment is mounted on the upper surface of a circuit substrate (not shown) in the same way as the foregoing semiconductor device 1. In this case, the outer portions 12 of a plurality of lead terminals 5 projected from the side of the resin member 35 are individually connected with a plurality of signal lines of the circuit substrate by means of solder, and the lower surface of both the end portions 34 of the radiation plate 32 exposed to the outside from both ends of the lower surface of the resin member 35 are connected with a conductor pattern such as ground wiring of the circuit substrate by means of solder.

In the state as described above, both the end portions 34 of the radiation plate 32 on which the pellet 2 is placed are exposed to the outside from the lower surface of the resin member 35, both the end portions 34 being directly connected with the conductor pattern of the circuit substrate by means of solder, and hence the heat generated in the pellet 2 can suitably be radiated to the circuit substrate by the radiation plate 32 through both the end portions 34 thereof. Further, since the central portion 33 of the radiation plate 32 on which the pellet 2 is placed is exposed to the outside from the upper surface of the resin member 35, the heat generated in the pellet 2 can preferably be radiated also to the ambient open air by the radiation plate 32 through the central portion 33 thereof.

As described above, the semiconductor device 31 of the present embodiment can radiate the heat generated in the pellet 2 to both the conductor pattern of the circuit substrate and the ambient open air through the radiation plate 32. Therefore, for example, even if the temperature of either one of the circuit substrate or the open air is high, when the temperature of the other one is low, it is possible to satisfactorily radiate the heat generated in the pellet 2.

Further, in the semiconductor device 31 of the present embodiment, as described above, the pellet 2 is placed upside down on the lower surface of the central portion 33 of the radiation plate 32, but since the bonding wires 7 connect the electrode pads 4 of the pellet 2 and the lower surface of the inner portions 6 of the lead terminals 5, this connection can easily be performed.

Further, as described above, since the inner portions 6 of the lead terminals 5 are positioned higher than the outer portions 12, the bonding wires 7 are not to be exposed outside from the resin member 35. Since both the end portions 34 of the radiation plate 32 are situated lower than the under surface of the pellet 2 but not right beneath thereof, connection by the bonding wires 7 is easy.

Furthermore, since both the end portions 34 of the radiation plate 32 are exposed to the outside from the under portion of the resin member 35, respectively, it is easy to connect both the end portions 34 of the radiation plate 32 to the conductor pattern of the circuit substrate by means of solder. Particularly, since both the end portions 34 of the radiation plate 32 are positioned in bottoms of the concave portions 36 of the resin member 35 each exposing the upper and the end surfaces to the outside, it can easily be connected in a large area to the conductor pattern of the circuit substrate by means of solder or the like.

A manufacturing method of the semiconductor device 31 according to the present embodiment will be described below in brief. First, by etching an infinitesimally thin metal plate, the lead frame 15 having a plurality of the lead terminals 5 and a piece of radiation plate 32 unitedly coupled by means of tiebars 13 is formed.

Since the central portion 33 and both the end portions 34 of the radiation plate 32 are separated by a pair of laterally slender slit-shaped penetration holes by the above etching process, by deforming the lead frame 15 by means of a lead forming die, the central portion 33 of the radiation plate 32 is bent into an upwardly projected convex form and both the end portions 34 are each bent into a downwardly projected concave form and concurrently the lead terminals 5 are bent into a crank form making inner portions 6 position higher than outer portions 12.

Next, by placing the pellet 2 on the lower surface of the central portion 33 of the radiation plate 32 in such a manner that the electrode pads 4 are positioned beneath, the electrode pads 4 on the lower surface of the pellet 2 and the lower surface of the inner portions 6 of the lead terminals 5 are connected with the bonding wires 7. At this time, actually it is preferable to connect the bonding wires 7 from above by disposing the lead frame 15 upside down.

The lead frame 15 in which the pellet 2 and the bonding wires 7 are placed in a unit in this way is disposed inside a cavity of a pair of detachable molds. At this time, by holding the outer portions 12 of the lead terminals 5 and both the end portions 34 of the radiation plate 32 with a pair of molds and at the same time making the upper surface of the central portion 33 of the radiation plate 32 contact the inner surface of the mold, these portions are arranged to be exposed outside from the resin member 35.

By filling melted resin in the cavity of the mold and making it solidify in the above described state, the resin member 35 is formed including the pellet 2, a part of radiation plate 32, the bonding wires 7 and the inner parts 6 of the lead terminals 5, all encapsulated in the resin member 35. Subsequently, by taking out this resin member 35 from the mold, removing such as flashes of resin and cutting off the tiebars 13 of the lead frame 15, the semiconductor device 31 is completed as shown in FIG. 8.

By manufacturing the semiconductor device 31 according to the method as described above, the structure of the semiconductor device 31, in which the upper surface of the central portion 33 of the radiation plate 32 is exposed to the outside from upper surface of the resin member 35 and the lower surfaces of both the end portions 34 of the radiation plate 32 are exposed to the outside from both ends of the lower surface of the resin member 35, can simply be realized.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:

a semiconductor pellet having a plurality of electrode pads;

a radiation plate having said semiconductor pellet mounted thereon;

a plurality of lead terminals each connected with each of said electrode pads by means of a bonding wire; and a resin member having a first surface and a second surface, said resin member encapsulating said semiconductor pellet, a part of said radiation plate, said bonding wires and a part of each of said lead terminals;

said radiation plate comprising a unitary substantially rectangular structure including,
   a central portion,
   two opposing side portions, and
   two opposing end portions, said central portion rising convexly through step portions from the first surface of said resin member to the level of said two opposing side portions, and said two opposing side portions rising concavely through step portions to the level of said two opposing end portions at the second surface of said resin member;

wherein the central portion of said radiation plate is exposed to the outside from the first surface of said resin member and said two end portions are exposed to the outside from the second surface of said resin member.

2. A semiconductor device according to claim 1, wherein said first surface of said resin member is a surface to be mounted on a circuit substrate and said second surface is an opposite surface of said first surface.

3. A semiconductor device according to claim 1, wherein said radiation plate comprises a sheet of metal plate, said central portion of said radiation plate being formed toward the first surface of said resin member from said opposing side portions and said end portions of said radiation plate at opposite ends of said central portion being formed toward the second surface of said resin member from said opposing side portions, and said semiconductor pellet is mounted on the central part of said radiation plate.

4. A semiconductor device according to claim 3, wherein said lead terminals are arrayed on the outside of both the side portions of said radiation plate.

5. A semiconductor device according to claim 3, wherein said second surface of said resin member is a surface to be mounted on a circuit substrate and said first surface is an opposite surface of said first surface.

6. A semiconductor device according to claim 5, wherein said lead terminals are arrayed on the outside of the side portions of said radiation plate.

* * * * *